United States Patent
Dikarev et al.

(10) Patent No.: US 10,790,932 B2
(45) Date of Patent: Sep. 29, 2020

(54) PADDING BITS FOR CSI REPORT CODING

(71) Applicant: Apple Inc., Cupertino, CA (US)

(72) Inventors: Dmitry Dikarev, Nizhny Novgorod (RU); Victor Sergeev, Nizhny Novgorod (RU); Ajit Nimbalker, Fremont, CA (US); Alexei Vladimirovich Davydov, Nizhny Novgorod (RU); Gregory Ermolaev, Nizhny Novgorod (RU)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/245,825

(22) Filed: Jan. 11, 2019

(65) Prior Publication Data

US 2019/0149266 A1    May 16, 2019

Related U.S. Application Data

(60) Provisional application No. 62/617,030, filed on Jan. 12, 2018.

(51) Int. Cl.

| | |
|---|---|
| *H04L 1/00* | (2006.01) |
| *H04W 28/06* | (2009.01) |
| *H04B 7/0456* | (2017.01) |
| *H04B 7/06* | (2006.01) |
| *H03M 13/13* | (2006.01) |
| *H04W 72/04* | (2009.01) |

(52) U.S. Cl.
CPC ......... *H04L 1/0042* (2013.01); *H03M 13/13* (2013.01); *H04B 7/0473* (2013.01); *H04B 7/0486* (2013.01); *H04B 7/063* (2013.01); *H04B 7/0626* (2013.01); *H04B 7/0632* (2013.01); *H04B 7/0636* (2013.01); *H04B 7/0639* (2013.01); *H04L 1/0008* (2013.01); *H04L 1/0026* (2013.01); *H04L 1/0029* (2013.01); *H04L 1/0031* (2013.01); *H04L 1/0057* (2013.01); *H04L 1/0072* (2013.01); *H04W 28/06* (2013.01); *H04W 72/0413* (2013.01)

(58) Field of Classification Search
CPC ... H04L 1/0026; H04L 1/0008; H04L 1/0042; H04W 28/06; H04B 7/0473; H04B 7/0632
See application file for complete search history.

(56) References Cited

U.S. PATENT DOCUMENTS

| | | | |
|---|---|---|---|
| 2015/0304674 A1* | 10/2015 | Lee | H04N 21/4302 382/232 |
| 2018/0083666 A1* | 3/2018 | Bayesteh | H04J 13/00 |
| 2019/0068268 A1* | 2/2019 | Zhang | H04W 72/042 |

* cited by examiner

*Primary Examiner* — Anez C Ebrahim
(74) *Attorney, Agent, or Firm* — Kowert, Hood, Munyon, Rankin & Goetzel, P.C.

(57) ABSTRACT

Described herein are methods and apparatus for jointly encoding components of a a channel state information (CSI) report into a single codeword. Padding bits are added to equalize payload size for different CRI/RI cases and to allow encoding of all parts of CSI into one codeword without payload ambiguity.

20 Claims, 6 Drawing Sheets

| | Information field $X_1$ for wideband PMI | | | Information field $X_2$ for wideband/partial band PMI | |
|---|---|---|---|---|---|
| | $[i_{1,1}, i_{1,2}]$ | | $[i_{1,3}]$ | $[i_2]$ | |
| | CodebookMode=1 | CodebookMode=2 | | CodebookMode=1 | CodebookMode=2 |
| Rank = 1 with >2 CSI-RS ports, $N_2 > 1$ | $\lceil \log_2(N_1 O_1 \cdot N_2 O_2) \rceil$ | $\lceil \log_2\left(\frac{N_1 O_1}{2} \cdot \frac{N_2 O_2}{2}\right) \rceil$ | N/A | 2 | 4 |
| Rank = 1 with >2 CSI-RS ports, $N_2 = 1$ | $\lceil \log_2(N_1 O_1 \cdot N_2 O_2) \rceil$ | $\lceil \log_2\left(\frac{N_1 O_1}{2}\right) \rceil$ | N/A | 2 | 4 |
| Rank=2 with 4 CSI-RS ports, $N_2 = 1$ | $\lceil \log_2(N_1 O_1 \cdot N_2 O_2) \rceil$ | $\lceil \log_2\left(\frac{N_1 O_1}{2}\right) \rceil$ | 1 | 1 | 3 |
| Rank=2 with >4 CSI-RS ports, $N_2 > 1$ | $\lceil \log_2(N_1 O_1 \cdot N_2 O_2) \rceil$ | $\lceil \log_2\left(\frac{N_1 O_1}{2} \cdot \frac{N_2 O_2}{2}\right) \rceil$ | 2 | 1 | 3 |
| Rank=2 with >4 CSI-RS ports, $N_2 = 1$ | $\lceil \log_2(N_1 O_1 \cdot N_2 O_2) \rceil$ | $\lceil \log_2\left(\frac{N_1 O_1}{2}\right) \rceil$ | 2 | 1 | 3 |
| Rank=3 or 4, with 4 CSI-RS ports | $\lceil \log_2(N_1 O_1 \cdot N_2 O_2) \rceil$ | | 0 | 1 | |
| Rank=3 or 4, with 8 or 12 CSI-RS ports | $\lceil \log_2(N_1 O_1 \cdot N_2 O_2) \rceil$ | | 2 | 1 | |
| Rank=3 or 4, with >=16 CSI-RS ports | $\lceil \log_2\left(\frac{N_1 O_1}{2} \cdot N_2 O_2\right) \rceil$ | | 2 | 1 | |
| Rank=5 or 6 | $\lceil \log_2(N_1 O_1 \cdot N_2 O_2) \rceil$ | | N/A | 1 | |
| Rank=7 or 8, $N_1 = 4, N_2 = 1$ | $\lceil \log_2\left(\frac{N_1 O_1}{2} \cdot N_2 O_2\right) \rceil$ | | N/A | 1 | |
| Rank=7 or 8, $N_1 > 2, N_2 = 2$ | $\lceil \log_2\left(N_1 O_1 \cdot \frac{N_2 O_2}{2}\right) \rceil$ | | N/A | 1 | |
| Rank=7 or 8, with $N_1 > 4, N_2 = 1$ or $N_1 = 2, N_2 = 2$ or $N_1 > 2, N_2 > 2$ | $\lceil \log_2(N_1 O_1 \cdot N_2 O_2) \rceil$ | | N/A | 1 | |

FIG. 3

|  | $A^{LI}$ | $A^{CQI}$ |
|---|---|---|
| 2 antenna ports | 1 | 4 |
| 4 antenna ports | 2 | 4 |
| >4 antenna ports — Rank1~4 | 2 | 4 |
| >4 antenna ports — Rank5~8 | 2 | 8 |

FIG. 4

| | |
|---|---|
| CSI report#1 | CRI#1 |
| | RI#1 |
| | LI#1 |
| | Padding bits block#1 |
| | PMI#1 |
| | CQI#1 |
| CSI report#2 | CRI#2 |
| | RI#2 |
| | LI#2 |
| | Padding bits block#2 |
| | PMI#2 |
| | CQI#2 |
| ... | ... |
| CSI report#n | CRI#n |
| | RI#n |
| | LI#n |
| | Padding bits block#n |
| | PMI#n |
| | CQI#n |

FIG. 5

| | |
|---|---|
| CSI report#1 | CRI#1 |
| | RI#1 |
| | Padding bits block#1 |
| | LI#1 |
| | PMI#1 |
| | CQI#1 |
| CSI report#2 | CRI#2 |
| | RI#2 |
| | Padding bits block#2 |
| | LI#2 |
| | PMI#2 |
| | CQI#2 |
| ... | ... |
| CSI report#n | CRI#n |
| | RI#n |
| | Padding bits block#n |
| | LI#n |
| | PMI#n |
| | CQI#n |

FIG. 6

| CRI block | CRI#1 |
| | CRI#2 |
| | ... |
| | CRI#n |
| RI block | RI#1 |
| | RI#2 |
| | ... |
| | RI#n |
| LI block | LI#1 |
| | LI#2 |
| | ... |
| | LI#n |
| Padding bits block | |
| PMI block | PMI#1 |
| | PMI#2 |
| | ... |
| | PMI#n |
| CQI block | CQI#1 |
| | CQI#2 |
| | ... |
| | CQI#n |

FIG. 7

| CRI block | CRI#1 |
| | CRI#2 |
| | ... |
| | CRI#n |
| RI block | RI#1 |
| | RI#2 |
| | ... |
| | RI#n |
| Padding bits block | |
| LI block | LI#1 |
| | LI#2 |
| | ... |
| | LI#n |
| PMI block | PMI#1 |
| | PMI#2 |
| | ... |
| | PMI#n |
| CQI block | CQI#1 |
| | CQI#2 |
| | ... |
| | CQI#n |

FIG. 8

PADDING BITS FOR CSI REPORT CODING

PRIORITY CLAIM

This application claims priority to U.S. Provisional Patent Application Ser. No. 62/617,030 filed on Jan. 12, 2018, which is incorporated herein by reference in its entirety.

TECHNICAL FIELD

Embodiments described herein relate generally to wireless networks and communications systems. Some embodiments relate to cellular communication networks including 3GPP (Third Generation Partnership Project) networks, 3GPP LTE (Long Term Evolution) networks, 3GPP LTE-A (LTE Advanced), and 3GPP fifth generation (5G) or new radio (NR) networks, although the scope of the embodiments is not limited in this respect.

BACKGROUND

In Long Term Evolution (LTE) and next generation new radio (NR) systems, a mobile terminal (referred to as a User Equipment or UE) connects to the cellular network via a base station (referred to as an evolved Node B or eNB or as a next generation Node B or gNB). The present disclosure relates to methods and apparatus by which a UE may more efficiently transmit channel state information (CSI) to a gNB.

DETAILED DESCRIPTION

Figure 1:
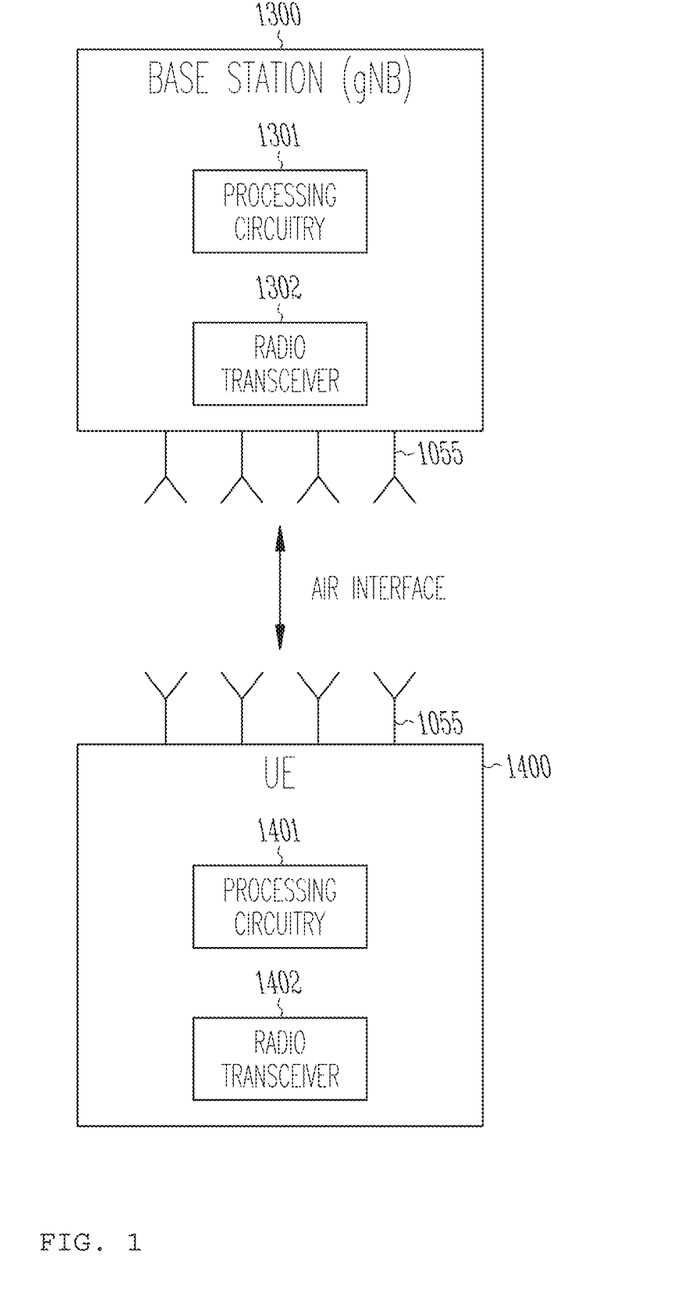
FIG. 1 is illustrates an example UE and a base station (BS) such as an eNB or gNB according to some embodiments.

In Long Term Evolution (LTE) and 5G systems, a mobile terminal (referred to as a User Equipment or UE) connects to the cellular network via a base station (BS), referred to as an evolved Node B or eNB in LTE systems and as a next generation evolved Node B or gNB in 5G or NR systems. FIG. 1 illustrates an example of the components of a UE 1400 and a base station (e.g., eNB or gNB) 1300. The BS 1300 includes processing circuitry 1301 connected to a radio transceiver 1302 for providing an air interface. The UE 1400 includes processing circuitry 1401 connected to a radio transceiver 1402 for providing an air interface over the wireless medium. Each of the transceivers in the devices is connected to antennas 1055. The antennas 1055 of the devices form antenna arrays whose directionality may be controlled by the processing circuitry. The memory and processing circuitries of the UE and/or BS may be configured to perform the functions and implement the schemes of the various embodiments described herein.

In order to perform scheduling and other link adaptation functions, the BS needs to know the downlink channel from the BS to the UE. LTE and NR provides reference signals that may be used by a UE to obtain downlink channel state information (CSI) for a transmitting cell, referred to as channel state information reference signals (CSI-RSs). The UE may then feedback the CSI thus obtained to the serving cell in the form of a CSI report. CSI-RS are transmitted using particular time-frequency resource element (REs) of an orthogonal frequency division multiple access (OFDMA) transmission scheme over the physical downlink shared channel (PDSCH) with a configurable periodicity and spanning the entire transmit band. Multiple sets of CSI-RSs may be transmitted by a cell with each set corresponding to a different antenna port. A UE may use the CSI-RSs to estimate the channel and produce a CSI report that is fed back to the serving cell either multiplexed with data over the PDSCH or via the physical uplink control channel (PUCCH). For periodic CSI reporting, the CSI report is encoded with a forward error correction (FEC) such as a polar code and sent over the PUCCH. A channel state information report may include a channel quality indicator (CQI) that represents the highest modulation and coding scheme that could be used in the channel without exceeding a specified error rate, a rank indicator (RI) that represents the number of spatial multiplexing layers that could be used in the channel, a precoding matrix indicator (PMI) that represents a preferred antenna weighting scheme for transmitting to the UE, a sub-band (SB) indicator that represents the subcarriers preferred by the UE, and a CSI-RS resource indicator (CRI) to indicate a preferred antenna beam. The NR standard adds a layer indicator (LI) to the list. In order to configure a UE to receive and process reference signals and to provide appropriate feedback in the form of CSI reports, the eNB signals the UE using the radio resource control (RRC) protocol to send what are referred to herein as higher layer parameters. An RRC message that transmits CSI-RS configuration information from an eNB to a UE originates in the RRC layer of the eNB and, after traversing the protocol layers, is then transmitted to the UE via the PDSCH. The UE then processes the message at its corresponding RRC layer.

In LTE, due to dependency between CSI components, coding of CRI/RI and PMI/CQI using a forward error correction (FEC) code is carried out independently from each other. The bitwidth of CRI/RI is typically known by the base station based on the higher layer configuration and/or derived from CSI-RS antenna port configuration and reported UE capability. Based on the decoded CRI/RI, the UE determines the payload size of PMI/CQI report. In particular, for LTE. if the reported RI is 1, the single CQI report should be assumed in the UCI, otherwise there are two CQI reports. In addition, the bitwidth of the PMI report also depends on the reported RI.

The LTE approach supports separate coding of CRI/RI and CQI/PMI in two codewords, where payload of CQI/PMI report is decided after decoding of the CRI/RI codeword. Separate coding of CSI components, however, is less efficient than joint one from channel coding perspective.

From an NR channel coding perspective, it is desirable to use the common coding for all CSI components. However, the dependency of the PMI/CQI payload on the current RI/CRI value may lead to payload size ambiguity on the decoder side. It is possible to avoid this by adding a certain amount of padding bits to the CSI payload. The number of padding bits may be made to depend on the current RI/CRI value and higher layer configuration. Described below are methods and apparatus to determine the padding bits quantity for joint CSI coding. The padding bits equalize payload size for different CRI/RI cases and allow encoding of all parts of CSI in one codeword without payload ambiguity.

Figure 2:
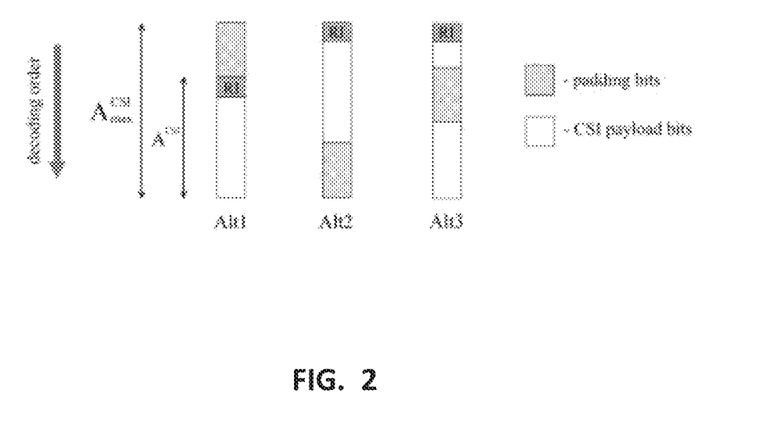
FIG. 2 illustrates alternative locations for padding bits.

In one embodiment, padding bits are appended to a CSI payload of size $A^{CSI}$ to make a result bit sequence, which is then passed to encoder input. The padding bits may be zeroes or any other fixed values. The amount of padding bits should be such that the result sequence is of size $A_{max}^{CSI}$ (where $A_{max}^{CSI}$ is the maximum possible CSI payload over all CRI/RI values with the current higher-layer MIMO configuration). The padding bits can be placed in continuous or non-continuous block at different positions inside CSI payload as illustrated in FIG. 2 which shows three alternatives labeled as:

Alt1—padding bits are placed at the start of result sequence

Alt2—padding bits are placed at the end of result sequence

Alt3—padding bits are placed in the middle of result sequence

Simulation results have shown that Alt3 is preferable since it gives some additional coding gain under sequential decoding, e.g., polar SCL decoding. For polar coding, the gain obtained can be described as follows. With Alt1, CRI/RI is decoded after all padding bits. Given this, it is not possible to determine the amount of padding bits prior to their decoding. They have to be decoded as information bits that leads to worst-case coding gain (same as with maximum payload $A_{max}^{CSI}$ in current MIMO configuration). With Alt2, CRI/RI is decoded before the padding bits. This allows a decoder to treat padding bits as frozen bits, which could increase the coding gain. However, this increase is negligible since these frozen appear after all the info bits are already decoded. Therefore, their impact on info bits BER is very limited. Alt3 provides the ability to decode CRI/RI before the padding bits, compute their quantity, treat padding bits as frozen and then decode other part of CSI payload. Implementation of such advanced decoding approach may provide significant coding gain. In one embodiment, the components of the CSI payload are ordered as follows: CRI, RI, LI, padding bits, PMI, and CQI.

In one embodiment, the amount of padding bits that is needed to be added to the CSI payload $A^{CSI}$ is specified depending on current CRI/RI value and higher layer configuration. The amount of padding bits to equalize the payload size over all CRI/RI values may be calculated as:

$$A_{padding} = A_{max}^{CSI} - A^{CSI}$$

where $A_{max}^{CSI} = A_{max}^{RI} + A_{max}^{CRI} + A_{max}^{LI} + A_{max}^{PMI} + A_{max}^{CQI}$.

The following symbols are defined as follows:

| Symbol | Description |
|---|---|
| $B_{RI} = \{RIi \mid RI\_Restriction \,\&\, 2^i = 1\}$ | a set of possible rank values allowed by higher layer parameter RI_Restriction |
| $B_{RI\,all} = \{1 \ldots RI_{max}\}$ | a set of all possible rank values defined in the standard |
| $n_{RI} = \lvert B_{RI} \rvert$ | a number of possible rank values allowed by higher layer parameter RI_Restriction |
| $n_{RI\,all} = \lvert B_{RI\,all} \rvert = RI_{max}$ | a number of possible rank values in the standard |
| $S$ | a number of different CSI-RS resource sets available according to higher layer parameter ResourceConfig |
| $B_{CRI,\,s},\, 0 \leq s < S$ | CSI-RS resource set s used for current CSI report according to higher layer parameter ResourseSetBitmap |
| $B_{CRI\,all} = \bigcup_s B_{CRI,s}$ | is a set of all possible CSI-RS resources defined in the standard |
| $K_s^{CSI-RS} = \lvert B_{CRI,\,s} \rvert,\, 0 \leq s < S$ | a number of CSI-RS resources in the resource set s |
| $K_{max}^{CSI-RS} = \max(\lvert B_{CRI,\,all} \rvert)$ | a maximum number of CSI-RS resources in the resource set defined in the standard |
| $N_1, N_2$ | numbers of antenna ports on BS divided by 2 over 2 dimensions |
| $O_1, O_2$ | oversampling values divided by 2 over 2 dimensions |
| $\lvert i_{1,1} \rvert, \lvert i_{1,2} \rvert, \lvert i_{1,3} \rvert, \lvert i_2 \rvert$ | bitwidths of PMI parts (PM indices) |
| $P_{CSI-RS} = 2 \cdot N_1 \cdot N_2$ | a number of CSI-RS ports |

In one embodiment, the maximum CSI payload is defined as a maximum payload possible under current RI_Restriction and ResourseSetBitmap parameters as configured by higher layers:

$$A_{max}^{CSI} = \max_{\substack{RI \in B_{RI} \\ CRI \in B_{CRI,s}}} (A^{CSI})$$

Then $$A_{max}^{RI} = \lceil \log_2 n_{RI} \rceil = A^{RI}$$

$$A_{max}^{CRI} = \lceil \log_2 K_s^{CSI-RS} \rceil = A^{CRI}$$

Figure 3:
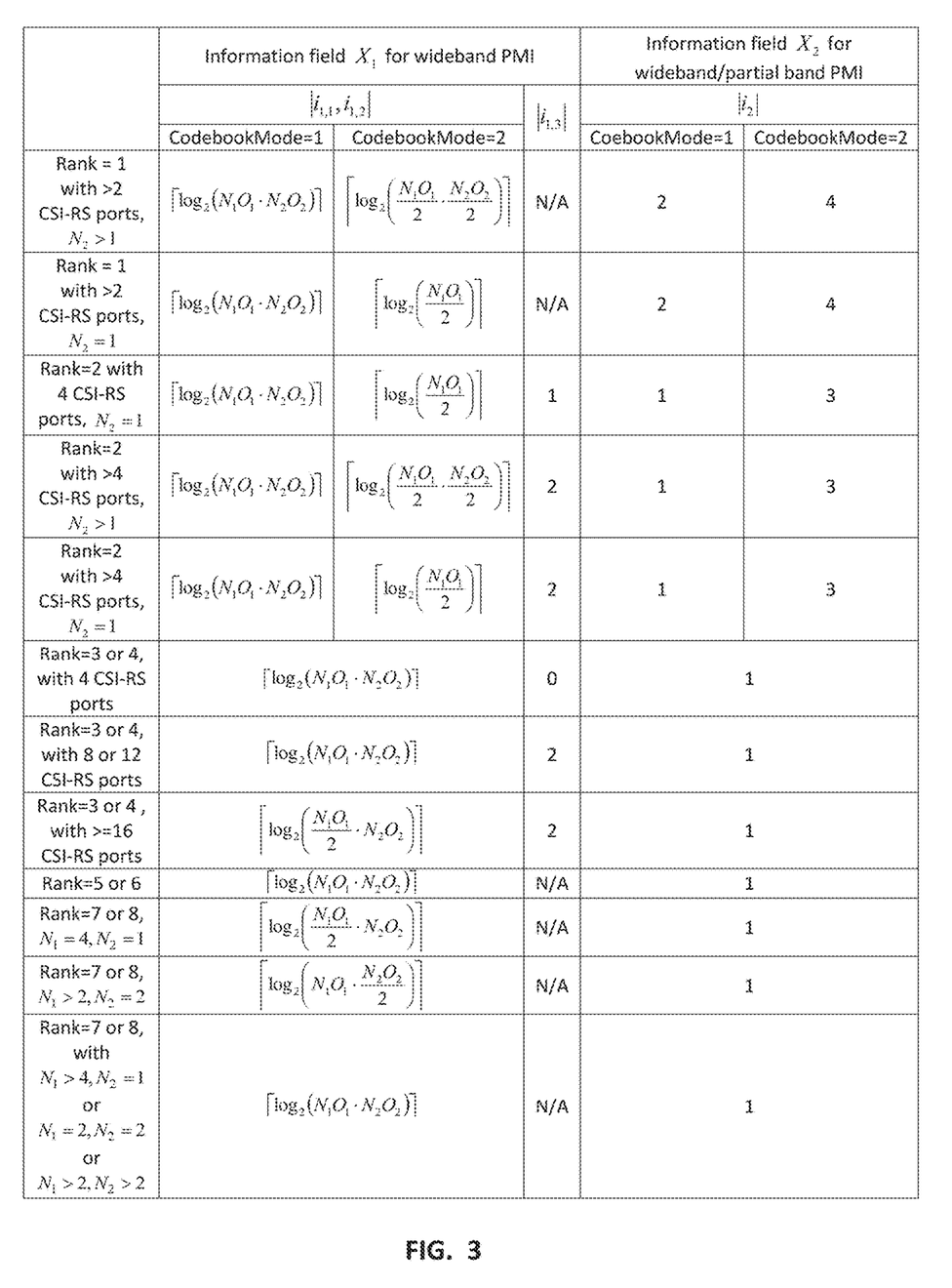
FIG. 3 illustrates PMI bitwidths for different parameter configurations.

Bitwidths $A^{LI}$, $A^{PMI}$ and $A^{CQI}$ are usually defined in tables with each row corresponding to some combination of RI value and higher layer parameters. Therefore $A_{max}^{LI}$, $A_{max}^{PMI}$ and $A_{max}^{CQI}$ can be found as a maximum over the rows corresponding to the allowed rank values set $B_{RI}$ and current higher layer configuration as shown in FIG. 3. FIG. 3 illustrates the PMI bitwidth for a CodebookType=TypeI-SinglePanel configuration. For example (where the modulo operation denotes the bitwidth of the parameter):

$$A_{max}^{PMI} = \max_{\substack{RI \in B_{RI} \\ N_1, N_2}} (A^{PMI}) = \max_{\substack{RI \in B_{RI} \\ N_1, N_2}} (\lvert i_{1,1} \rvert + \lvert i_{1,2} \rvert + \lvert i_{1,3} \rvert + \lvert i_2 \rvert)$$

Similarly, LI and CQI maximum sizes can be found as the maximums over the table rows corresponding to the allowed rank values set $B_{RI}$.

$$A_{max}^{LI} = \max_{RI \in B_{RI}} (A^{LI})$$

$$A_{max}^{CQI} = \max_{RI \in B_{RI}} (A^{CQI})$$

Figure 4:
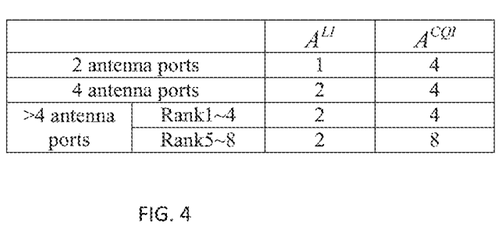
FIG. 4 illustrates an example table of LI and CQI bitwidths for different parameter configurations.

FIG. 4 illustrates an example table of LI and CQI bitwidths for a CodebookType=TypeI-SinglePanel configuration. The total padding bits quantity may then be defined as:

$$A_{padding} = A^{RI} + A^{CRI} + \max_{RI \in B_{RI}} (A^{LI}) +$$
$$\max_{\substack{RI \in B_{RI} \\ N_1, N_2}} (|i_{1,1}, i_{1,2}| + |i_{1,3}| + |i_2|) + \max_{RI \in B_{RI}} (A^{CQI}) - A^{CSI}$$

In another embodiment, the maximum CSI payload is defined as a maximum CSI payload possible in the standard:

$$A_{max}^{CSI} = \max_{\substack{RI \in B_{RI, all} \\ CRI \in B_{CRI, all}}} (A^{CSI})$$

Then $$A_{max}^{RI} = \lceil \log_2 n_{RI\,all} \rceil = \lceil \log_2 RI_{max} \rceil, \text{ e.g. } 3$$

$$A_{max}^{CRI} = \lceil \log_2 K_{max}^{CSI-RS} \rceil, \text{ e.g. } 6$$

$$A_{max}^{LI} = \max(A^{LI}), \text{ e.g. } 2$$

$$A_{max}^{PMI} = \max_{N_1, N_2} (|i_{1,1}, i_{1,2}| + |i_{1,3}| + |i_2|), \text{ e.g. } \lceil \log_2(N_1 O_1 \cdot N_2 O_2) \rceil + 3$$

$$A_{max}^{CQI} = \max(A^{CQI}), \text{ e.g. } 8$$

The total padding bits quantity may then be defined as:

$$A_{padding} = \lceil \log_2 RI_{max} \rceil + \lceil \log_2 K_{max}^{CSI-RS} \rceil +$$
$$\max(A^{LI}) + \max(A^{PMI}) + \max(A^{CQI}) - A^{CSI}$$

e.g. $A_{padding} = 3 + 6 + 2 + \lceil \log_2(N_1 O_1 \cdot N_2 O_2) \rceil + 8 - A^{CSI} =$
$= 19 + \lceil \log_2(N_1 O_1 \cdot N_2 O_2) \rceil - A^{CSI}$ e.g.. $A_{padding} =$
$19 + \max \lceil \log_2(N_1 O_1 \cdot N_2 O_2) \rceil - A^{CSI} = 19 + 18 - A^{CSI} = 27 - A^{CSI}$ In some situations, a base station may request a UE to transmit several CSI reports. In other embodiments, multiple CSI payloads representing multiple CSI reports are encoded as described above. Such methods allow encoding of these multiple CSI reports into one codeword which is more efficient than separate coding.

Figure 5:
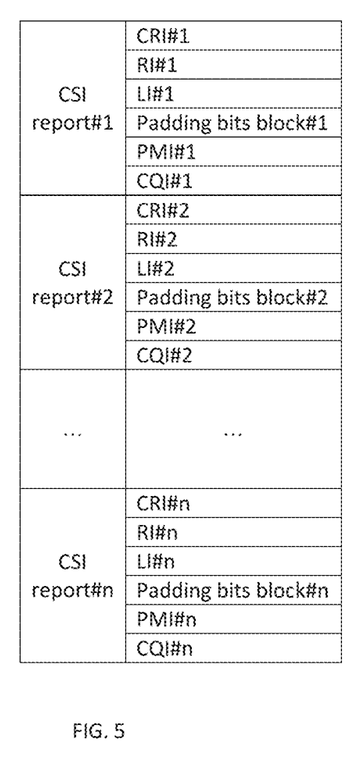
FIGS. 5 through 8 illustrate alternatives for encoding multiple CSI payloads for multiple CSI reports into a single codeword.
Figure 6:
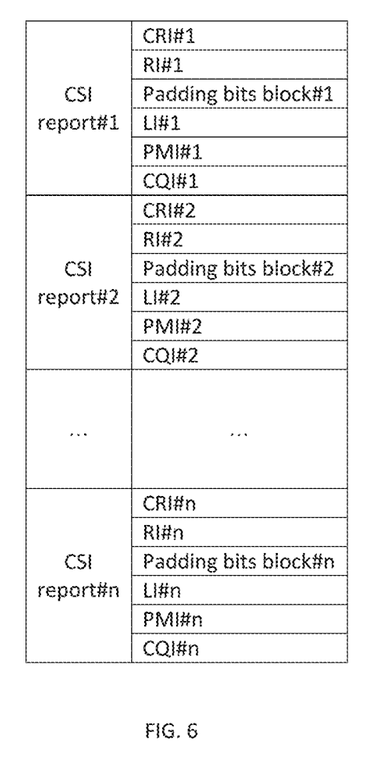

FIG. 5 illustrates one alternative for encoding the multiple CSI payloads for CSI reports #1 through #n successively in a single codeword. The multiple CSI payloads representing the multiple CSI reports ordered sequentially to form a single encoder input bit sequence for encoding into the single codeword. The order of the components for each CSI payload is: CRI, RI, LI, padding bits, PMI, and CQI. FIG. 6 illustrates another alternative for encoding the multiple CSI payloads for CSI reports #1 through #n successively in a single codeword in which the order of the components for each CSI payload is: CRI, RI, padding bits, LI, PMI, and CQI. The padding bits quantity may be defined as:

$$A_{padding\,\#i} = A_{max}^{CSI\,\#i} - A^{CSI\,\#i}$$

Figure 7:
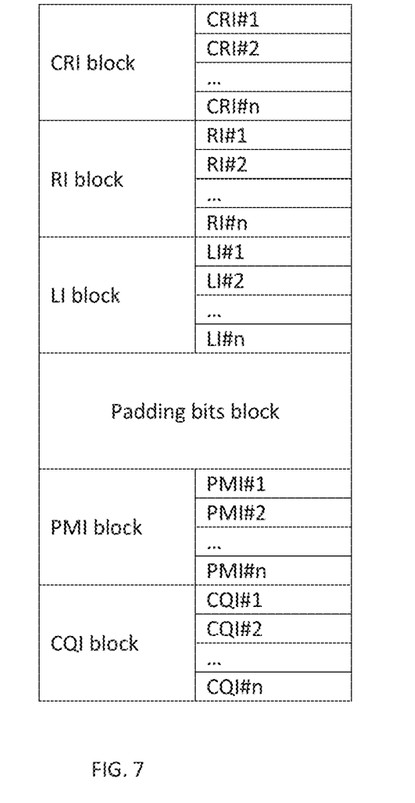
Figure 8:
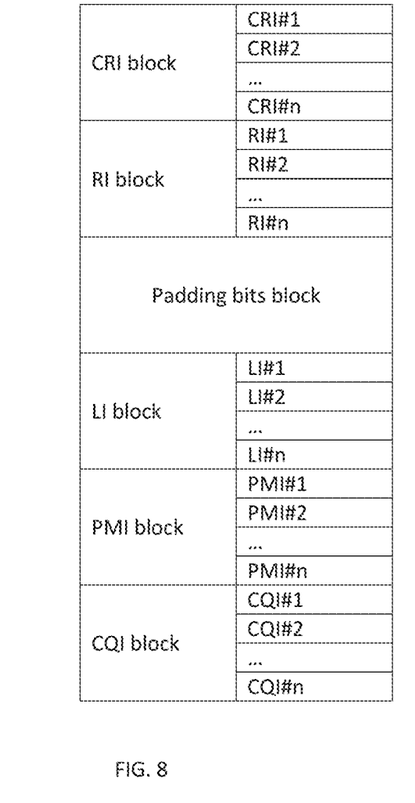

FIGS. 7 and 8 illustrate other alternatives for encoding the multiple CSI payloads for CSI reports #1 through #n in a single codeword in which the components of the CSI payloads are grouped into blocks that are successively encoded. In FIG. 7, the order of the blocks is: CRI block, RI block, LI block, padding bits block, PMI block, and CQI block. In FIG. 8, the order of the blocks is: CRI block, RI block, padding bits block, LI block, PMI block, and CQI block. The padding bits quantity may be defined as:

$$A_{padding} = \sum_{i=1}^{n} (A_{max}^{CSI\,\#i} - A^{CSI\,\#i})$$

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect. An example LTE system includes a number of mobile stations, defined by the LTE specification as User Equipment (UE), communicating with a base station, defined by the LTE specifications as an eNodeB.

Antennas referred to herein may comprise one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to 1/10 of a wavelength or more.

In some embodiments, a receiver as described herein may be configured to receive signals in accordance with specific communication standards, such as the Institute of Electrical and Electronics Engineers (IEEE) standards including IEEE 802.11-2007 and/or 802.11(n) standards and/or proposed specifications for WLANs, although the scope of the disclosure is not limited in this respect as they may also be suitable to transmit and/or receive communications in accordance with other techniques and standards. In some embodiments, the receiver may be configured to receive signals in accordance with the IEEE 802.16-2004, the IEEE 802.16(e) and/or IEEE 802.16(m) standards for wireless metropolitan area networks (WMANs) including variations and evolutions thereof, although the scope of the disclosure is not limited in this respect as they may also be suitable to transmit and/or receive communications in accordance with other techniques and standards. In some embodiments, the receiver may be configured to receive signals in accordance with the Universal Terrestrial Radio Access Network (UTRAN) LTE communication standards. For more information with respect to the IEEE 802.11 and IEEE 802.16 standards, please refer to "IEEE Standards for Information Technology—Telecommunications and Information Exchange between Systems"—Local Area Networks—Specific Requirements—Part 11 "Wireless LAN Medium Access Control (MAC) and Physical Layer (PHY), ISO/IEC 8802-11: 1999", and Metropolitan Area Networks—Specific Requirements—Part 16: "Air Interface for Fixed Broadband Wireless Access Systems," May 2005 and related amendments/versions. For more information with respect to UTRAN LTE standards, see the 3rd Generation Partnership Project (3GPP) standards for UTRAN-LTE, release 8, March 2008, including variations and evolutions thereof.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. An apparatus for a user equipment (UE), the apparatus comprising:
   one or more processors, wherein the one or more processors are configured to:
   use a forward error correction code (FEC) to jointly encode all reported components of one or more channel state information (CSI) payloads that each represent a CSI report into a single codeword for transmission over a physical uplink control channel (PUCCH);
   wherein the reported CSI payload components that are jointly encoded include one or more of: a CSI reference signal (CSI-RS) resource indicator (CRI), a rank indicator (RI), a layer indicator (LI), a precoding matrix indicator (PMI), or a channel quality indicator (CQI); and,
   add a number of padding bits as necessary to the CSI payload before encoding to make the bitwidth of the CSI payload equal to a predetermined maximum allowable CSI payload bitwidth wherein the components of the CSI payload are ordered as follows: CR1, RI, LI, padding bits, PMI, and CQI.

2. The apparatus of claim 1, wherein the number of padding bits $A_{padding}$ is calculated as:
$A_{padding} = A_{max}^{CSI} - A^{CSI}$
where $A^{CSI}$ is the bitwidth of the reported components of the CSI payload and $A_{max}^{CSI}$ is the maximum allowable CSI payload bitwidth.

3. The apparatus of claim 2, wherein the bitwidth of the reported components of the CSI payload $A^{CSI}$ is a function of the reported RI and wherein the maximum allowable CSI payload bitwidth $A_{max}^{CSI}$ is a function of a set of allowed RI values.

4. The apparatus of claim 1, wherein the predetermined maximum allowable CSI payload bitwidth is determined by parameters to be received from a next generation Node B (gNB).

5. The apparatus of claim 4, wherein the parameters that determine the maximum allowable CSI payload bitwidth include a set of allowed RI values as indicated by higher layer parameter ri_restriction.

6. The apparatus of claim 4, wherein the parameters that determine the maximum allowable CSI payload bitwidth include a CSI-RS resource set to be used for CSI reporting and the number of resources in the CSI-RS resource set.

7. The apparatus of claim 4, wherein the parameters that determine the maximum allowable CSI payload bitwidth include the number of CSI-RS ports.

8. The apparatus of claim 1, wherein the maximum allowable CSI payload bitwidth includes a maximum allowable PMI bitwidth that is a function of parameters to be received from a next generation Node B (gNB) that include the number of CSI-RS ports divided over two dimensions designated $N_1$ and $N_2$ and corresponding oversampling factors divided over two dimensions for codebook vectors referenced by the PMI designated as $O_1$ and $O_2$.

9. The apparatus of claim 1, wherein the maximum allowable CSI payload bitwidth $A_{max}^{CSI}$ is calculated as:
$A_{max}^{CSI} = \max(A^{PMI}(r) + A^{CQI}(r) + A^{LI}(r))$ where $\max(A^{PMI}(r)+A^{CQI}(r)+A^{LI}(r))$ is the maximum of the sum of the PMI bitwidth $A^{PMI}(r)$, the CQI bitwidth $A^{CQI}(r)$, and the LI bitwidth $A^{LI}(r)$ over a set of rank values allowed to be reported.

10. The apparatus of claim 1, wherein the FEC code is a polar code.

11. The apparatus of claim 1, wherein multiple CSI payloads representing multiple CSI reports are ordered sequentially to form a single encoder input bit sequence for encoding into the single codeword.

12. A user equipment (UE), the UE comprising:
one or more memory mediums; and
one or more processors coupled to the one or more memory mediums, wherein the one or more processors are configured to cause the UE to:
use a forward error correction code (FEC) to jointly encode all reported components of one or more channel state information (CSI) payloads that each represent a CSI report into a single codeword for transmission over a physical uplink control channel (PUCCH), wherein the one or more memory mediums are configured to store the one or more CSI payloads;
wherein the reported CSI payload components that are jointly encoded include one or more of: a CSI reference signal (CSI-RS) resource indicator (CRI), a rank indicator (RI), a layer indicator (LI), a precoding matrix indicator (PMI), and a channel quality indicator (CQI);
add a number of padding bits as necessary to the CSI payload before encoding to make the bitwidth of the CSI payload equal to a maximum allowable CSI payload bitwidth, wherein the number of padding bits $A_{padding}$ is calculated as:
$A_{padding} = A_{max}^{CSI} - A^{CSI}$ where $A^{CSI}$ is the bitwidth of the reported components of the CSI payload and $A_{max}^{CSI}$ is the maximum allowable CSI payload bitwidth; and,
wherein the bitwidth of the reported components of the CSI payload $A^{CSI}$ is a function of the reported RI and wherein the maximum allowable CSI payload bitwidth $A_{max}^{CSI}$ is a function of a set of allowed RI values to be received from a next generation Node B (gNB).

13. The UE of claim 12, wherein the maximum allowable CSI payload bitwidth $A_{max}^{CSI}$ is further a function of parameters to be received from a next generation Node B (gNB) that include a CSI-RS resource set to be used for CSI reporting and the number of resources in the CSI-RS resource set.

14. The UE of claim 12, wherein the maximum allowable CSI payload bitwidth $A_{max}^{CSI}$ is further a function of parameters to be received from a next generation Node B (gNB) that include the number of CSI-RS ports.

15. The UE of claim 12, wherein the padding bits are zeroes.

16. A non-transitory computer-readable storage medium comprising instructions to cause a user equipment (UE), upon execution of the instructions by one or more processors, to:
use a forward error correction code (FEC) to jointly encode all reported components of one or more channel state information (CSI) payloads that each represent a CSI report into a single codeword for transmission over a physical uplink control channel (PUCCH);
wherein the reported CSI payload components that are jointly encoded include: a CSI reference signal (CSI-RS) resource indicator (CRI), a rank indicator (RI), a layer indicator (LI), a precoding matrix indicator (PMI), and a channel quality indicator (CQI); and,
add a number of padding bits as necessary to the CSI payload before encoding to make the bitwidth of the CSI payload equal to a predetermined maximum allowable CSI payload bitwidth wherein the components of the CSI payload are ordered as follows: CRI, RI, LI, padding bits, PMI, and CQI.

17. The medium of claim 16, wherein the number of padding bits $A_{padding}$ is calculated as:
$A_{padding} = A_{max}^{CSI}$ where $A^{CSI}$ is the bitwidth of the reported components of the CSI payload and $A_{max}^{CSI}$ is the maximum allowable CSI payload bitwidth.

18. The medium of claim 16, wherein the bitwidth of the reported components of the CSI payload $A^{CSI}$ is a function of the reported RI and wherein the maximum allowable CSI payload bitwidth $A_{max}^{CSI}$ is a function of the number of allowed RI values.

19. The medium of claim 16, wherein the predetermined maximum allowable CSI payload bitwidth is determined by parameters to be received from a next generation Node B (gNB).

20. The medium of claim 16, wherein the maximum allowable CSI payload bitwidth $A_{max}^{CSI}$ is calculated as:
$A_{max}^{CSI} = \max(A^{PMI}(r)+A^{CQI}(r)+A^{LI}(r))$
where $\max(A^{PMI}(r)+A^{CQI}(r)+A^{LI}(r))$ is the maximum of the sum of the PMI bitwidth $A^{PMI}(r)$, the CQI bitwidth $A^{CQI}(r)$, and the LI bitwidth $A^{LI}(r)$ over a set of rank values allowed to be reported.

* * * * *